(12) United States Patent
Blin

(10) Patent No.: US 11,394,384 B2
(45) Date of Patent: *Jul. 19, 2022

(54) RADIO-FREQUENCY SWITCHES AND RELATED CIRCUITS

(71) Applicant: SKYWORKS SOLUTIONS, INC., Irvine, CA (US)

(72) Inventor: Guillaume Alexandre Blin, Carlisle, MA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/909,157

(22) Filed: Jun. 23, 2020

(65) Prior Publication Data

US 2020/0395936 A1 Dec. 17, 2020

Related U.S. Application Data

(63) Continuation of application No. 16/236,431, filed on Dec. 29, 2018, now Pat. No. 10,693,459.

(60) Provisional application No. 62/612,535, filed on Dec. 31, 2017.

(51) Int. Cl.
*H03K 17/687* (2006.01)
*H03K 17/00* (2006.01)
*H03K 17/693* (2006.01)

(52) U.S. Cl.
CPC ....... *H03K 17/6874* (2013.01); *H03K 17/005* (2013.01); *H03K 17/693* (2013.01)

(58) Field of Classification Search
CPC . H03K 17/6874; H03K 17/693; H03K 17/005
See application file for complete search history.

(56) References Cited

U.S. PATENT DOCUMENTS

| | | | |
|---|---|---|---|
| 9,692,410 B2* | 6/2017 | Seshita | H03K 17/693 |
| 2013/0009725 A1* | 1/2013 | Heaney | H03K 19/017509 333/103 |
| 2015/0171860 A1* | 6/2015 | Blin | H03K 17/162 438/275 |
| 2016/0156345 A1* | 6/2016 | Jang | H03K 17/161 327/379 |
| 2017/0005651 A1* | 1/2017 | Ishimaru | H01L 23/66 |
| 2018/0131369 A1* | 5/2018 | Popplewell | H01L 27/0274 |

* cited by examiner

*Primary Examiner* — John W Poos
(74) *Attorney, Agent, or Firm* — Chang & Hale LLP

(57) ABSTRACT

Radio-frequency switches and related circuits are disclosed. In some embodiments, a switching device can include a series arm having transistors implemented in a stack configuration between first and second nodes. The switching device can further include a shunt arm having transistors implemented in a stack configuration between the first node and a ground node. The switching device can further include a bias architecture having a series arm bias circuit and a shunt arm bias circuit. The series arm bias circuit can be configured to bias the transistors of the series arm and include a gate-gate resistor that couples each pair of neighboring transistors. The shunt arm bias circuit can be configured to bias the transistors of the shunt arm and include a gate-gate resistor that couples each pair of neighboring transistors.

14 Claims, 16 Drawing Sheets

RADIO-FREQUENCY SWITCHES AND RELATED CIRCUITS

CROSS-REFERENCE TO RELATED APPLICATION(S)

This application is a continuation of U.S. application Ser. No. 16/236,431 filed Dec. 29, 2018, entitled BIASING ARCHITECTURES AND METHODS FOR LOWER LOSS SWITCHES, which claims priority to and the benefit of the filing date of U.S. Provisional Application No. 62/612,535 filed Dec. 31, 2017, entitled BIASING ARCHITECTURE FOR LOWER LOSS SWITCHES, the benefits of the filing dates of which are hereby claimed and the disclosures of which are hereby expressly incorporated by reference herein in their entirety.

BACKGROUND

Field

The present disclosure relates to biasing of radio-frequency (RF) switches.

Description of the Related Art

In electronics applications, devices such as field-effect transistors (FETs) can be utilized as switches. Such switches can allow, for example, routing of radio-frequency (RF) signals in wireless applications.

SUMMARY

According to some implementations, the present disclosure relates to a switching device that includes a first node and a second node, and a series arm including a plurality of transistors implemented in a stack configuration between the first node and the second node. Each transistor has a source, a drain and a gate, and the transistors are configured to be in an ON state or an OFF state to respectively allow or inhibit passage of a signal between the first and second nodes. The switching device further includes a shunt arm having a plurality of transistors implemented in a stack configuration between the first node and a ground node, with each transistor having a source, a drain and a gate. The transistors of the shunt arm are configured to be in an ON state when the transistors of the series arm are in the OFF state, or an OFF state when the transistors of the series arm are in the ON state. The switching device further includes a bias architecture having a series arm bias circuit and a shunt arm bias circuit. The series arm bias circuit is configured to bias the transistors of the series arm and includes a gate-gate resistor that couples each pair of neighboring transistors. The shunt arm bias circuit is configured to bias the transistors of the shunt arm and includes a gate-gate resistor that couples each pair of neighboring transistors.

In some embodiments, the transistors of the series arm and the transistors of the shunt arm can be implemented as silicon-on-insulator devices. In some embodiments, the series arm bias circuit can further include a common feed node implemented at a center node of a chain formed by the gate-gate resistors between the first and second nodes. In some embodiments, the shunt arm bias circuit can further include a common feed node implemented at an end node of a chain formed by the gate-gate resistors between the first and ground nodes. The end node can be connected to the ground node.

In some embodiments, the first node can be an input node and the second node can be an output node for the signal. In some embodiments, the second node can be an input node and the first node can be an output node for the signal.

In some embodiments, the series arm bias circuit can further include a drain-source resistor that couples the drain and source of a respective transistor of the series arm, and the shunt arm bias circuit can further include a drain-source resistor that couples the drain and source of a respective transistor of the shunt arm.

In some embodiments, the series arm bias circuit can further include a body-body resistor that couples bodies of each pair of neighboring transistors, and the shunt arm bias circuit can further include a body-body resistor that couples bodies of each pair of neighboring transistors. The series arm bias circuit can further include a common feed node implemented at a center node of a chain formed by the body-body resistors between the first and second nodes. The shunt arm bias circuit can further include a common feed node implemented at an end node of a chain formed by the body-body resistors between the first and ground nodes. The end node can be connected to the ground node.

In some teachings, the present disclosure relates to a switching die that includes a semiconductor substrate and a switch implemented on the semiconductor substrate. The switch includes a series arm having a plurality of transistors implemented in a stack configuration between a first node and a second node, with each transistor having a source, a drain and a gate. The transistors are configured to be in an ON state or an OFF state to respectively allow or inhibit passage of a signal between the first and second nodes. The switch further includes a shunt arm having a plurality of transistors implemented in a stack configuration between the first node and a ground node, with each transistor having a source, a drain and a gate. The transistors of the shunt arm are configured to be in an ON state when the transistors of the series arm are in the OFF state, or an OFF state when the transistors of the series arm are in the ON state. The switch further includes a bias architecture having a series arm bias circuit and a shunt arm bias circuit. The series arm bias circuit is configured to bias the transistors of the series arm and includes a gate-gate resistor that couples each pair of neighboring transistors. The shunt arm bias circuit is configured to bias the transistors of the shunt arm and includes a gate-gate resistor that couples each pair of neighboring transistors.

In some embodiments, the semiconductor substrate can include a silicon-on-insulator substrate.

In accordance with a number of implementations, the present disclosure relates to a switching module that includes a packaging substrate configured to receive a plurality of components, and a switch implemented on the packaging substrate. The switch includes a series arm having a plurality of transistors implemented in a stack configuration between a first node and a second node, with each transistor having a source, a drain and a gate. The transistors are configured to be in an ON state or an OFF state to respectively allow or inhibit passage of a signal between the first and second nodes. The switch further includes a shunt arm having a plurality of transistors implemented in a stack configuration between the first node and a ground node, with each transistor having a source, a drain and a gate. The transistors of the shunt arm are configured to be in an ON state when the transistors of the series arm are in the OFF state, or an OFF state when the transistors of the series arm are in the ON state. The switch further includes a bias architecture having a series arm bias circuit and a shunt arm bias circuit. The series arm bias circuit is configured to bias the transistors of the series arm and includes a gate-gate resistor that couples each pair of neighboring transistors. The shunt arm bias circuit is configured to bias the transistors of the shunt arm and includes a gate-gate resistor that couples each pair of neighboring transistors.

In some embodiments, substantially all of the switch can be implemented on a common die. In some embodiments, the common die can be a silicon-on-insulator die. In some embodiments, the switching module can be an antenna switch module or a front-end module.

In some implementations, the present disclosure relates to a wireless device that includes an antenna configured to support either or both of transmission and reception of signals, and a switch in communication with the antenna and configured to support the transmission and/or reception of the signals. The switch includes a series arm having a plurality of transistors implemented in a stack configuration between a first node and a second node, with each transistor having a source, a drain and a gate. The transistors are configured to be in an ON state or an OFF state to respectively allow or inhibit passage of a signal between the first and second nodes. The switch further includes a shunt arm having a plurality of transistors implemented in a stack configuration between the first node and a ground node, with each transistor having a source, a drain and a gate. The transistors of the shunt arm are configured to be in an ON state when the transistors of the series arm are in the OFF state, or an OFF state when the transistors of the series arm are in the ON state. The switch further includes a bias architecture having a series arm bias circuit and a shunt arm bias circuit. The series arm bias circuit is configured to bias the transistors of the series arm and includes a gate-gate resistor that couples each pair of neighboring transistors. The shunt arm bias circuit is configured to bias the transistors of the shunt arm and includes a gate-gate resistor that couples each pair of neighboring transistors.

In some embodiments, the wireless device can be configured to support cellular transmit and receive operations with the switch.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In some radio-frequency (RF) applications, RF switches and passive components can be utilized. Such RF switches can include a plurality of switching elements such as field-effect transistors (FETs). Such switching elements are commonly arranged in a stack configuration to support appropriate handling of power. For example, a higher FET stack number (sometimes referred to as height) can be utilized to allow an RF switch to withstand high power.

When such FETs are in an OFF state, they can be thought of as acting as a shunt "high" impedance respect to ground. Such an OFF stack will typically present a capacitance Coff and an impedance Roff that can create mismatch loss (e.g., due to Coff) and/or dissipative loss (e.g., due to Roff). In a situation where a high voltage is applied to the OFF stack, the dissipative loss due to Roff can become significant (e.g., similar to a tuning or resonant circuit). Such an effect can also reduce the quality factor (Q), and thus usefulness, of a corresponding resonant circuit.

Described herein are examples related to architectures, circuits, methods and devices in which gate, drain-source and/or body resistances (e.g., resistors) can be utilized to bias the transistors in a switch stack so as to reduce dissipative losses. Although various examples are described in the context of FETs, it will be understood that one or more features of the present disclosure can also be implemented in switch stacks utilizing other types of transistors, other types of switching elements, etc.

In some implementations, a switching architecture as described herein can include one or more of the following features: (1) an increase in Roff to ground, (2) optimized or desired configuration of series arm and/or shunt arm of the switch, and reduced areas of resistors to minimize or reduce the resistance roll-off over frequency, thus mitigating the natural degradation of loss at higher frequencies.

Figure 2:
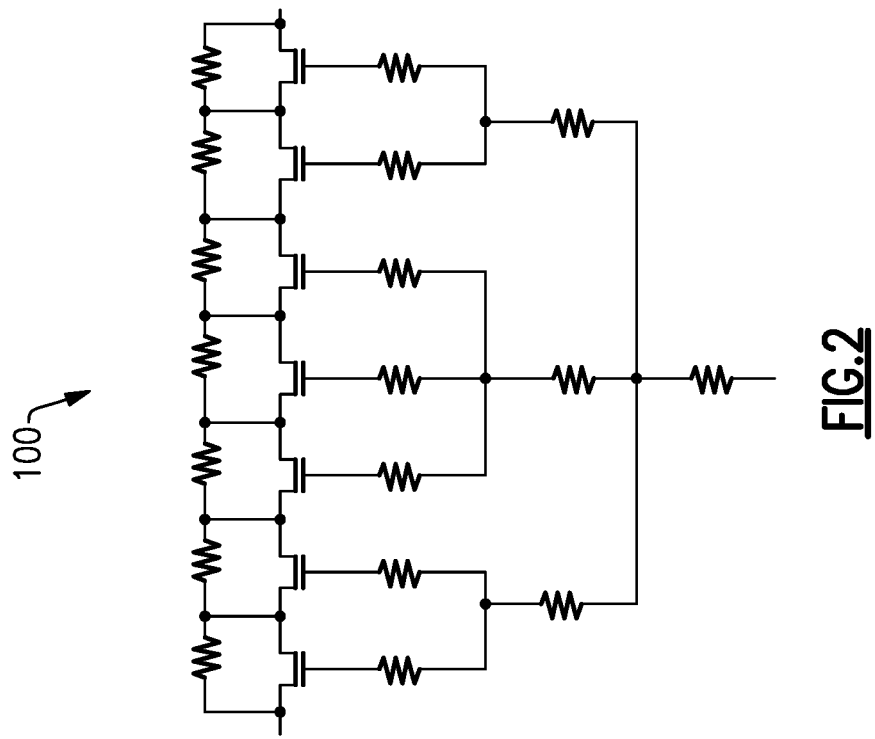
FIG. 2 shows another example of a biasing architecture for a switch stack.
Figure 1:
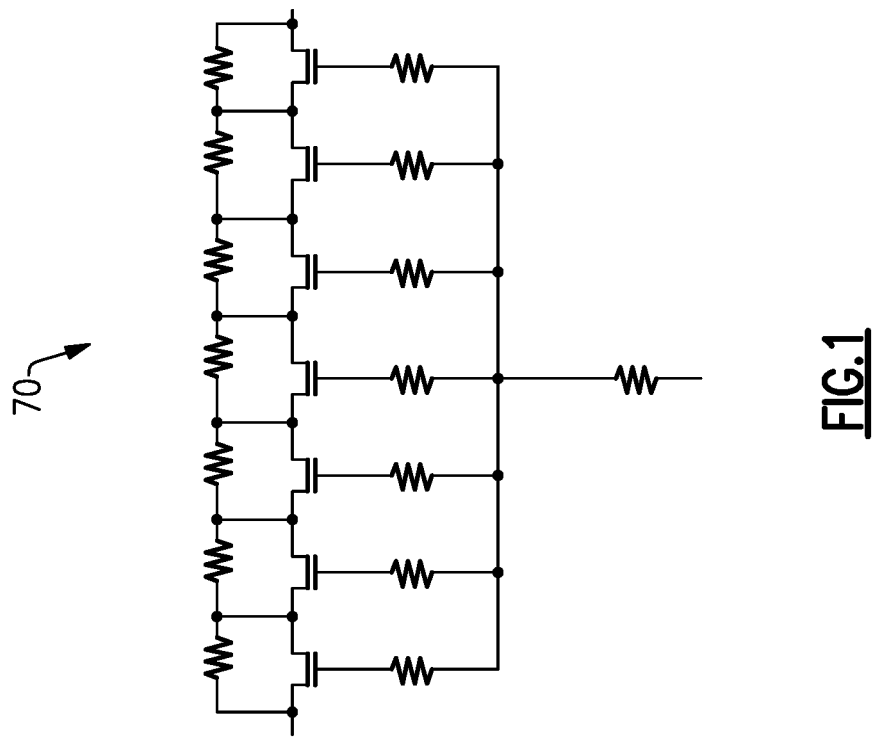
FIG. 1 shows an example of a biasing architecture for a switch stack.

FIGS. 1 and 2 show examples of biasing architectures 70, 100 for switch stacks. Additional details concerning such biasing architectures can be found in U.S. Publication No. 2015/0171860 entitled CIRCUITS AND METHODS FOR IMPROVED QUALITY FACTOR IN A STACK OF TRANSISTORS, which is expressly incorporated by reference in its entirely, and its disclosure is to be considered part of the specification of the present application. The same U.S. Publication No. 2015/0171860 also includes examples of products in which one or more features of the present disclosure can be implemented.

Figure 3:
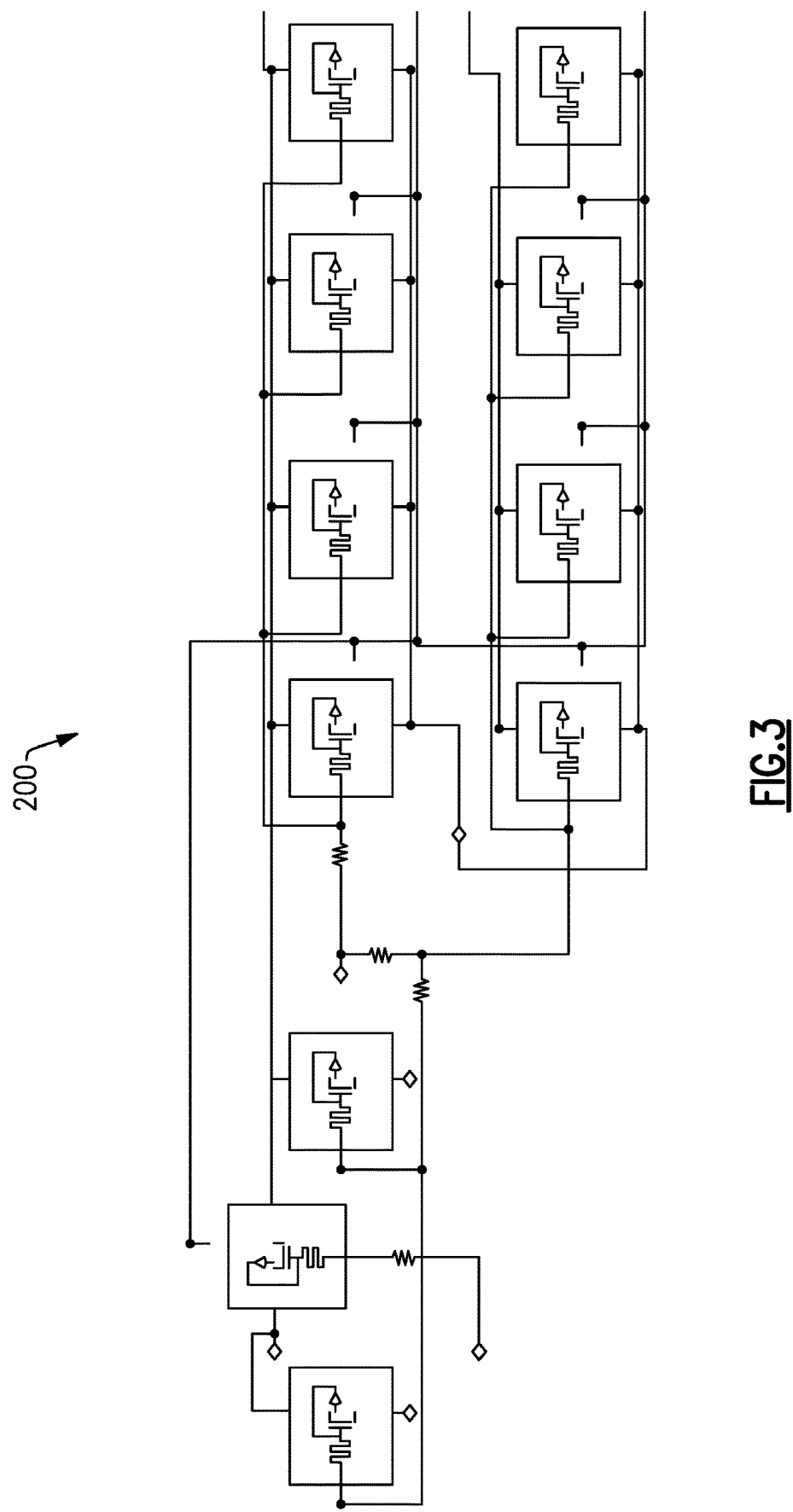
FIG. 3 shows a schematic of a simulation model that can be utilized to obtain one or more features of a biasing architecture for a switch.

FIG. 3 shows a schematic 200 of a simulation model that can be utilized to obtain one or more features of a switch biasing architecture for an example switch having single-pole-seven-throw (SP7T) functionality. With such a model, various configurations can be simulated. For example, first series arm can be ON and seventh series arms can be OFF (grounded), and two shunt arms corresponding to the foregoing two example series arms can be OFF (with the remaining shunt arms being ON). In the example simulation model, no matching circuit is provided; however, such absence of matching circuit is acceptable, since reduction of dissipative loss is a goal.

Figure 5:
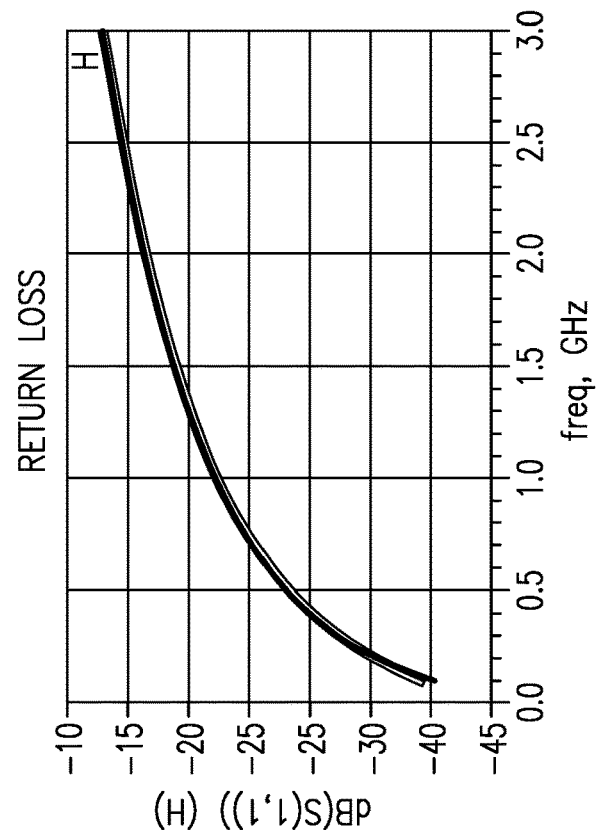
FIG. 5 shows return loss plots for the switch biasing configurations of FIG. 4.
Figure 4:
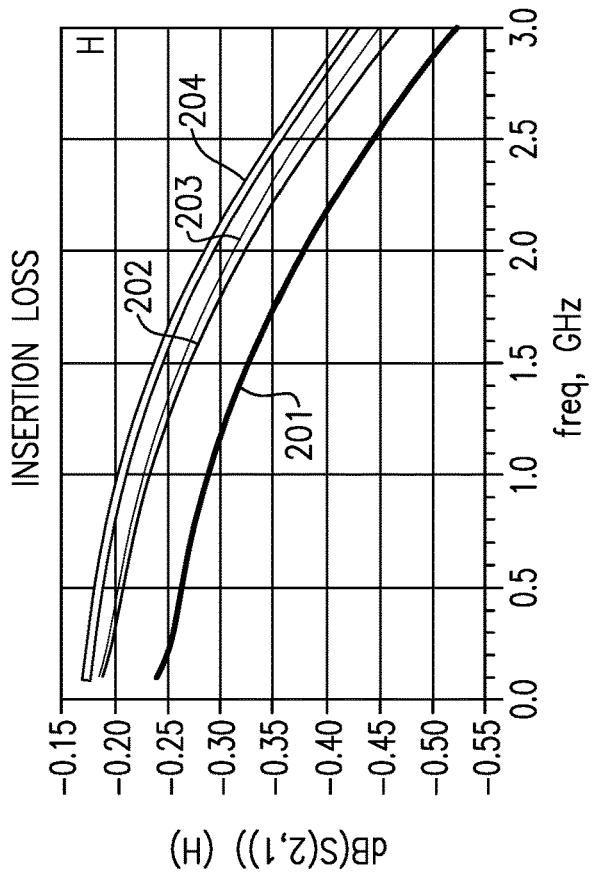
FIG. 4 shows insertion loss plots as a function of frequency, for different switch biasing configurations, for the example simulation model of FIG. 3.

FIG. 4 shows insertion loss plots as a function of frequency, for different switch biasing configurations, for the foregoing example simulation model. More particularly, in the example simulation model, the first series arm is ON, the seventh series arm is OFF, the first and seventh shunt arms are OFF, second to sixth series arms are OFF, and second to sixth shunt arms are ON. FIG. 5 shows return loss plots for the same example switch biasing configurations as in FIG. 4. It is noted that the return loss plots are generally similar for the various switch biasing configurations.

For the insertion loss plots of FIG. 4, it is noted that plot 201 corresponds to a baseline switch configuration operated in a high-band region. Plot 202 corresponds to a biasing configuration with gate-gate resistors as described herein, implemented only in a shunt arm (e.g., each of the two OFF shunt arms corresponding to the first and seventh series arms of the example of FIG. 3). Such an example shunt arm utilizes 0.7 µm gate-gate resistors. Plot 203 corresponds to a biasing configuration with gate-gate resistors as described herein, implemented only in a series arm (e.g., each of the seven series arms of FIG. 3). Such an example series arm utilizes 3 µm gate-gate resistors. Plot 204 corresponds to a biasing configuration with gate-gate resistors as described herein, implemented in both a shunt arm and a series arm (e.g., each of the two OFF shunt arms corresponding to the first and seventh series arms, and each of the seven series arms, of FIG. 3). Such example shunt and series arms utilize 0.7 µm and 3 µm gate-gate resistors, respectively.

Referring to the insertion loss plots of FIG. 4, it is noted that the biasing configuration with gate-gate resistors for both series arms and shunt arms (plot 204) has a reduction of dissipative loss by an amount of about 0.08 dB when compared to the baseline insertion loss profile. Further, such reduction in dissipative loss has broadband characteristics.

It is noted that in the example simulation of FIGS. 3-5, parasitic capacitance is not fully accounted for. It is believed that such a parasitic effect is directionally correct; and may or may not lower insertion loss improvement. It is also noted that the contribution to the insertion loss improvement from the two shunt arms (plot 202) is almost the same as the one from seven series arms (plot 203). Such an observation can be utilized to implement a number of biasing configurations in which gate-gate resistors are implemented in series arm (s), shunt arm(s), or any combination thereof, to achieve a desired result for a given switch.

Figure 6:
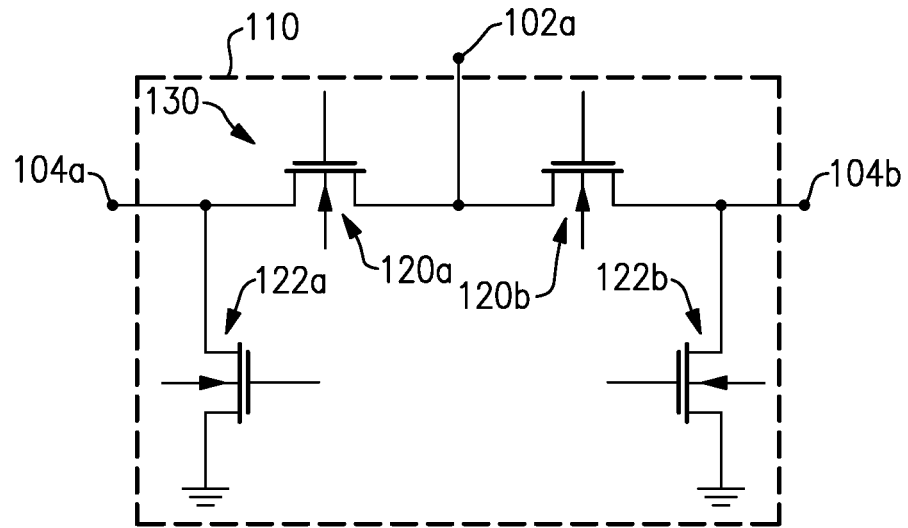
FIG. 6 shows an example switch configuration having a single-pole-double-throw (SPDT) functionality.

FIG. 6 shows an example switch configuration 130 implemented in a switch device 110 having a single-pole-double-throw (SPDT) functionality. As described herein, including the example of FIGS. 3-5, it will be understood that one or more features of the present disclosure can also be implemented in switching configurations having different numbers of poles and/or different numbers of throws.

In the example of FIG. 6, the switch device 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the switch device 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the switch device 110 through the second throw node 104b is shunted to the ground so as to reduce undesirable interference effects to the pole-to-first-throw operation.

In the example of FIG. 6, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 7:
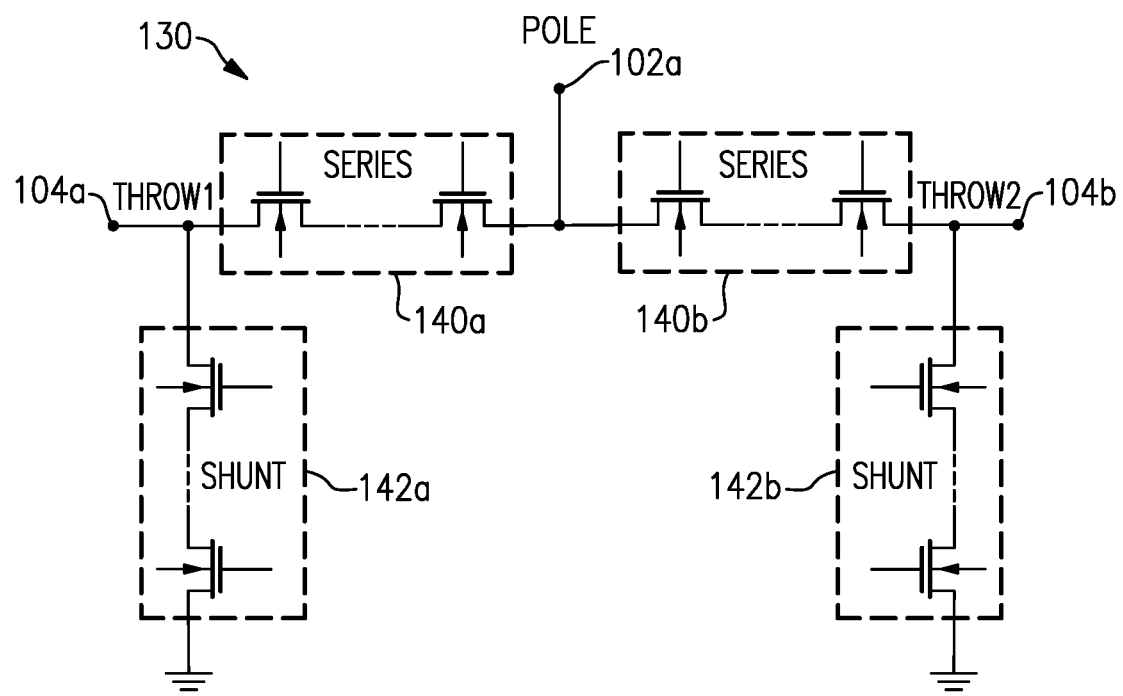
FIG. 7 shows that in some embodiments, switching functionalities between the pole and the throws of the example configuration of FIG. 6 can be provided by switch arm segments.

An example switch configuration 130 having such switch arm segments is shown in FIG. 7. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the switch 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the switch 130 through the second throw node 104b is shunted to the ground so as to reduce undesirable interference effects to the pole-to-first-throw operation.

In some implementations, a switch arm segment (e.g., 140a, 140b, 142a, 142b) can include one or more semiconductor transistors such as FETs. In some embodiments, such FET(s) may be capable of being in a first state or a second state and can include a gate, a drain, a source, and a body (sometimes also referred to as a substrate). In some embodiments, such FET(s) can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 8:
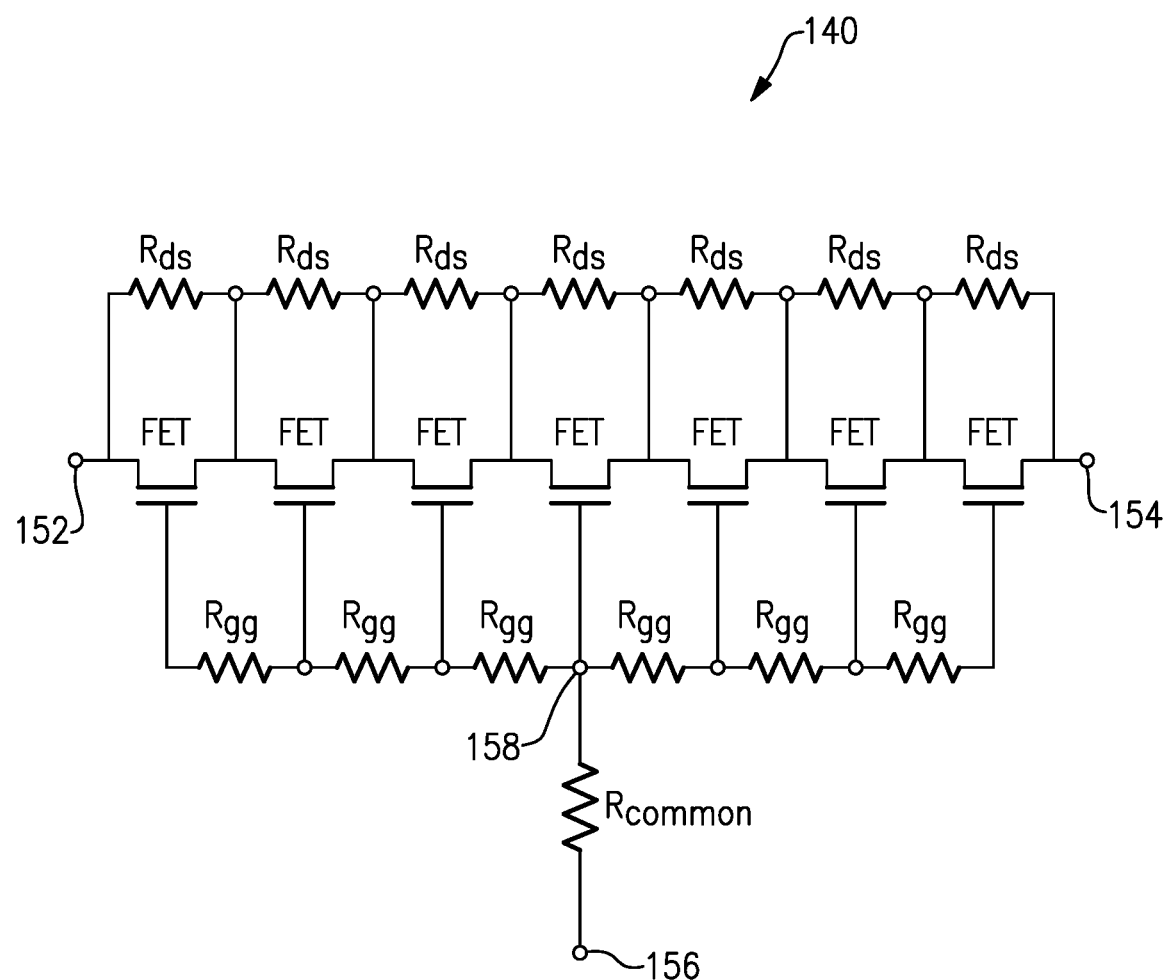
FIG. 8 shows a series arm that can be implemented for either or both of the series arms of FIG. 7.

FIG. 8 shows a series arm 140 that can be implemented for either or both of the series arms 140a, 140b of FIG. 7. In the example of FIG. 8, seven FETs are shown to be arranged in a stack between signal nodes 152, 154. In some embodiments, the signal node 152 can be an input node, in which case the signal node 154 acts as an output node; or the signal node 154 can be an input node, in which case the signal node 152 acts as an output node.

FIG. 8 shows that in some embodiments, drain and source of each FET can be coupled by a drain-source resistance (e.g., resistor) $R_{ds}$. Thus, the seven example drain-source resistors are shown to be arranged in series, with each in-between-resistors node being coupled to a corresponding in-between FETs node. In some embodiments, each of the drain-source resistors $R_{ds}$ can have an approximately same resistance value.

FIG. 8 further shows that in some embodiments, gates of neighboring pair of FETs can be coupled by a gate-gate resistance (e.g., resistor) $R_{gg}$. Accordingly, the six example gate-gate resistors are shown to be arranged in series, with each in-between-resistors node being coupled to a corresponding gate, and each end node of the resistor chain being coupled to a corresponding gate of the end FET.

In some embodiments, the gates of the FETs can be provided with bias signals from a bias signal node 156, through a common resistor $R_{common}$, through a feed node 158, and through respective one or more gate-gate resistors $R_{gg}$s. In some embodiments, the feed node 158 can be selected to be a center feed node, or an approximately center feed node. Such a symmetry or an approximate symmetry can accommodate the series arm 140 operating in either direction (e.g., to provide swapping functionality). For example, if there is an odd number of FETs in a stack, the center feed node can be coupled to the gate of the center FET. In another example, if there is an even number of FETs in a stack, the center feed node can be coupled to the gate of the first FET from the FET-center, or to a node between two center FETs.

In some embodiments, each of the gate-gate resistors can have an approximately same resistance value. Such a resistance value $R_{gg}$ can be selected to provide a desired Roff characteristics. An example of such a resistance value $R_{gg}$ for an example FET stack is described herein in reference to FIG. 9.

In some embodiments, a drain-source resistance value $R_{ds}$ can be selected to provide a desired functionality. For example, a reduced drain-source resistance value $R_{ds}$ can provide a lower roll-off at a higher frequency. In another example, a reduced drain-source resistance value $R_{ds}$ can be selected to maintain an acceptable switching time. An example of such a resistance value $R_{ds}$ for an example FET stack is described herein in reference to FIG. 9.

In some embodiments, the bodies of the FETs may or may not be biased. If such body-biasing is present, such biasing can be implemented similar to the gate biasing configuration. For example, body-body resistors can be provided similar to the gate-gate resistors, and such an arrangement of body-body resistors can be provided with a center feed node for biasing the bodies of the FETs.

Figure 9:
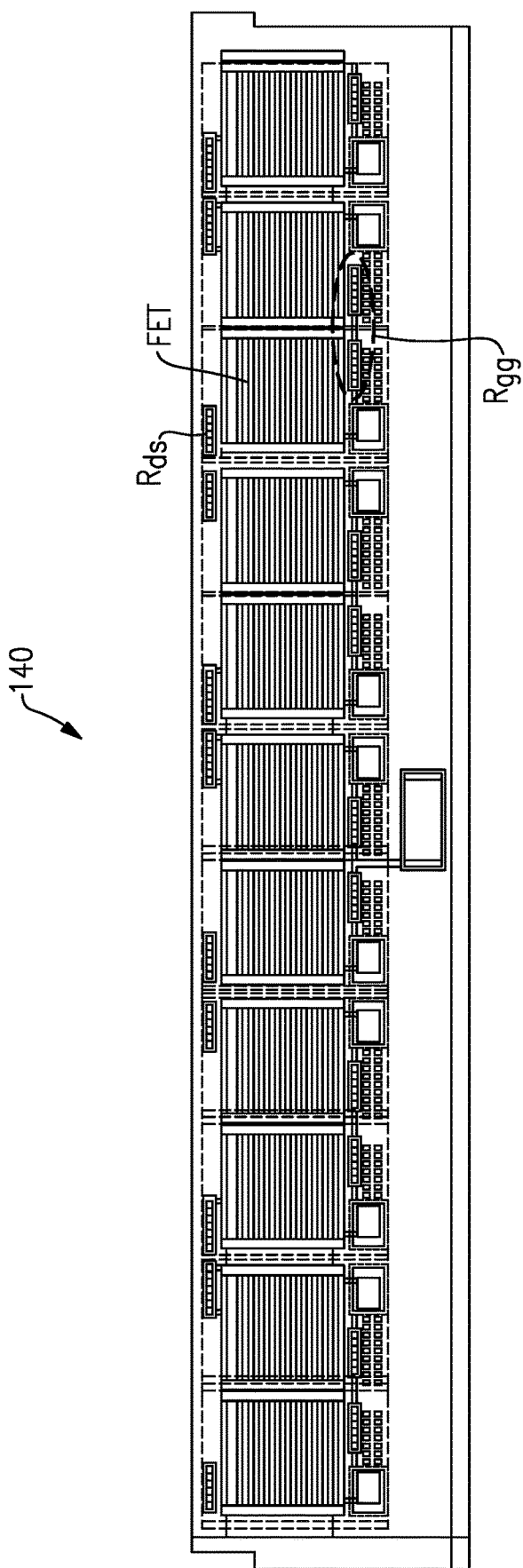
FIG. 9 shows an example layout of a series arm having eleven field-effect transistors (FETs) arranged in a stack.

FIG. 9 shows an example layout of a series arm 140 having eleven FETs arranged in a stack. Drain-source resistors ($R_{ds}$) and gate-gate resistors ($R_{gg}$) are indicated. In the example of FIG. 9, each FET is a 3 µm device, each drain-source resistor ($R_{ds}$) has a resistance value of approximately 10KΩ and dimensions of approximately W/L=0.75 µm/5 µm, each gate-gate resistor ($R_{gg}$) has a resistance value of approximately 7.7KΩ and dimensions of approximately W/L=0.75 µm/4 µm, and the common resistor ($R_{common}$) has a resistance value of approximately 45KΩ and dimensions of approximately W/L=1 µm/(10×3)µm. It is noted that the common resistor ($R_{common}$) can have a relatively large length, and thus a relatively large resistance value, to accommodate a relatively large peak voltage that can be encountered by the series arm 140 when in the ON state.

In some embodiments, and as described above, the foregoing resistors (drain-source, gate-gate, and common) can be implemented as relatively narrow resistors, without serpentine configuration, and such resistor configurations can be implemented in a layout to minimize or reduce parasitic capacitance resulting from inter-resistors routing effect. In some embodiments, at least the drain-source and gate-gate resistors can have relatively small values as described herein to provide a reduction in dissipative loss. In some embodiments, such a reduction in dissipative loss may be accompanied by an increase in switching and settling times. Examples of such switching and settling times are described herein in greater detail.

Figure 10:
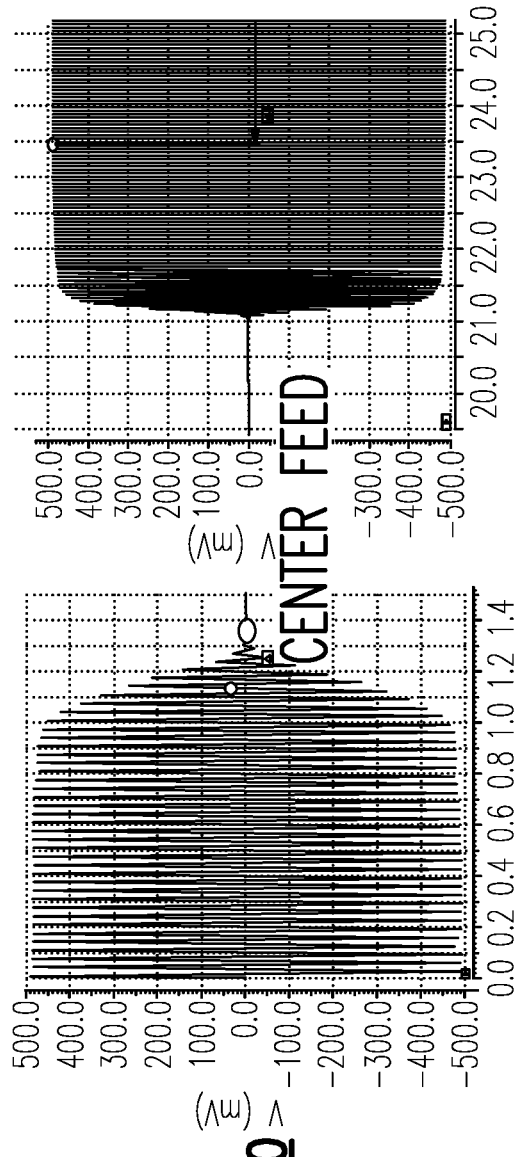
FIG. 10 shows an example of a switching time characteristic of the example series arm of FIG. 9.
Figure 11:
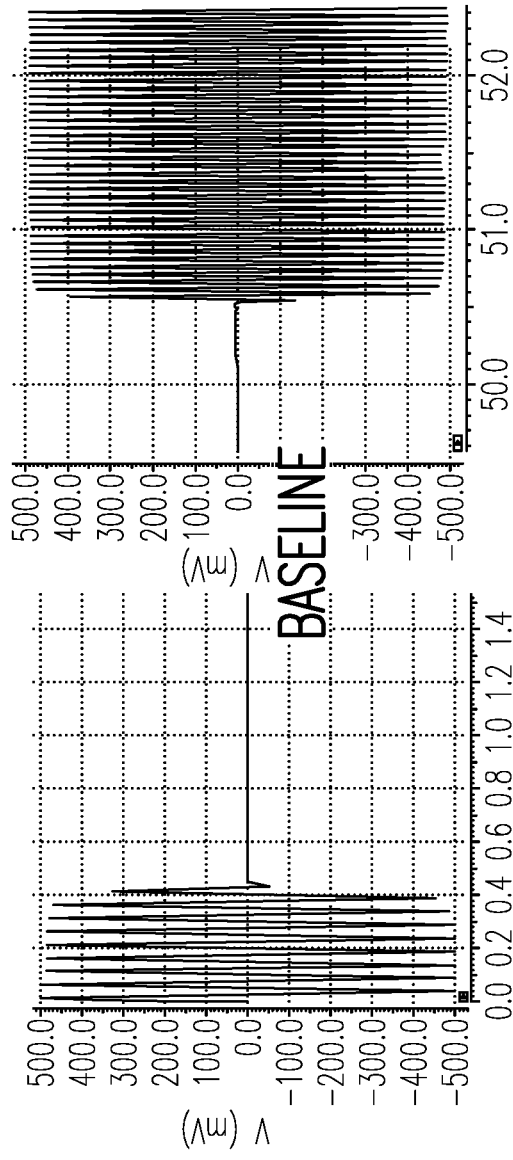
FIG. 11 shows a switching time characteristic of a baseline series arm.

FIG. 10 shows an example of a switching time characteristic of the example series arm of FIG. 9, and FIG. 11 shows a switching time characteristic of the baseline series arm (e.g., the baseline configuration described herein in reference to FIGS. 4 and 5). From the examples of FIGS. 10 and 11, it is noted that for the baseline configuration, each of the turn-off time Toff and the turn-on time Ton is less than 1 µs. For the example series arm of FIG. 9, the turn-off time Toff is less than 1.5 µs, and the turn-on time Ton is less than 3.5 µs. Thus, one can see that switching time can be slower for the example of FIG. 9; however, such switching times can be sufficient for some switching applications.

Figure 12:
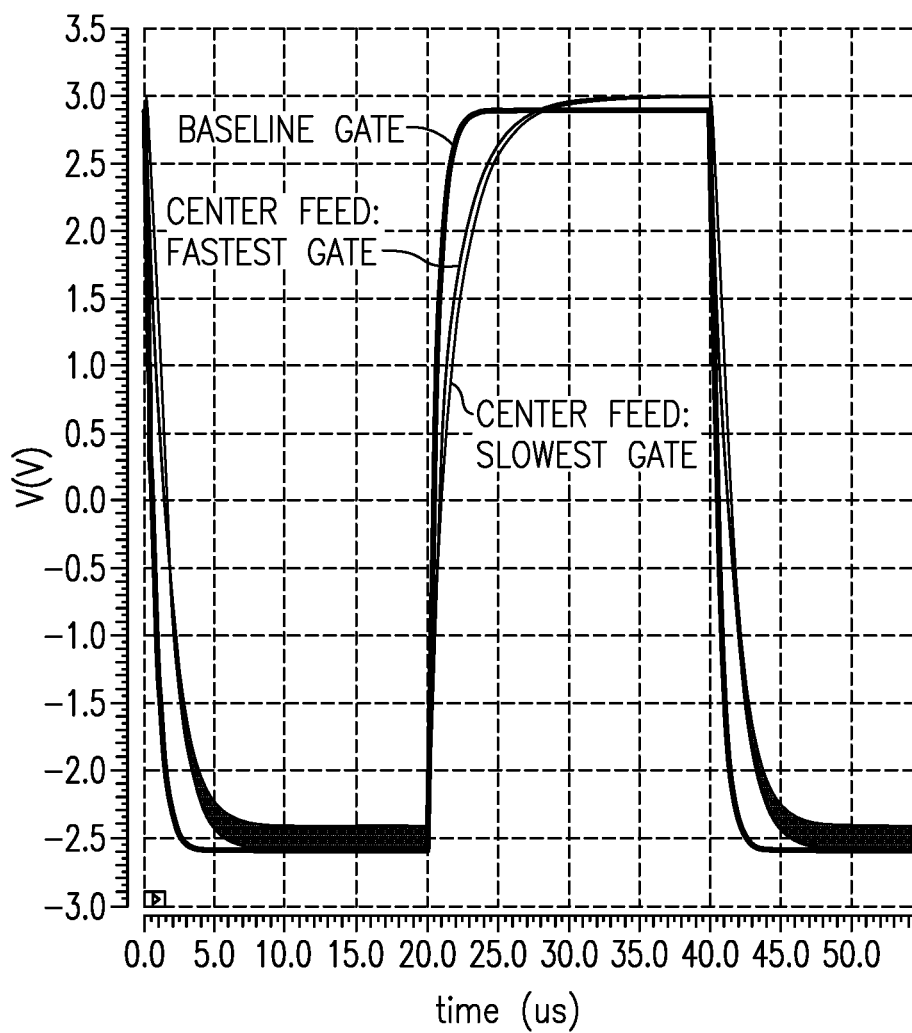
FIG. 12 shows examples of settling time characteristics of the example series arm of FIG. 9, and the baseline series arm.

FIG. 12 shows examples of settling time characteristics of the example series arm of FIG. 9 (center feed with slowest gate and center feed with fastest gate), and the baseline series arm (e.g., the baseline configuration described herein in reference to FIGS. 4 and 5). From the examples of FIG. 12, it is noted that for the baseline configuration, the settling time is approximately 2.5 µs. For the example series arm of FIG. 9, the settling time is approximately 10 µs. Thus, one can see that settling time can be slower for the example of FIG. 9; however, such settling time can be sufficient for some switching applications.

Figure 13:
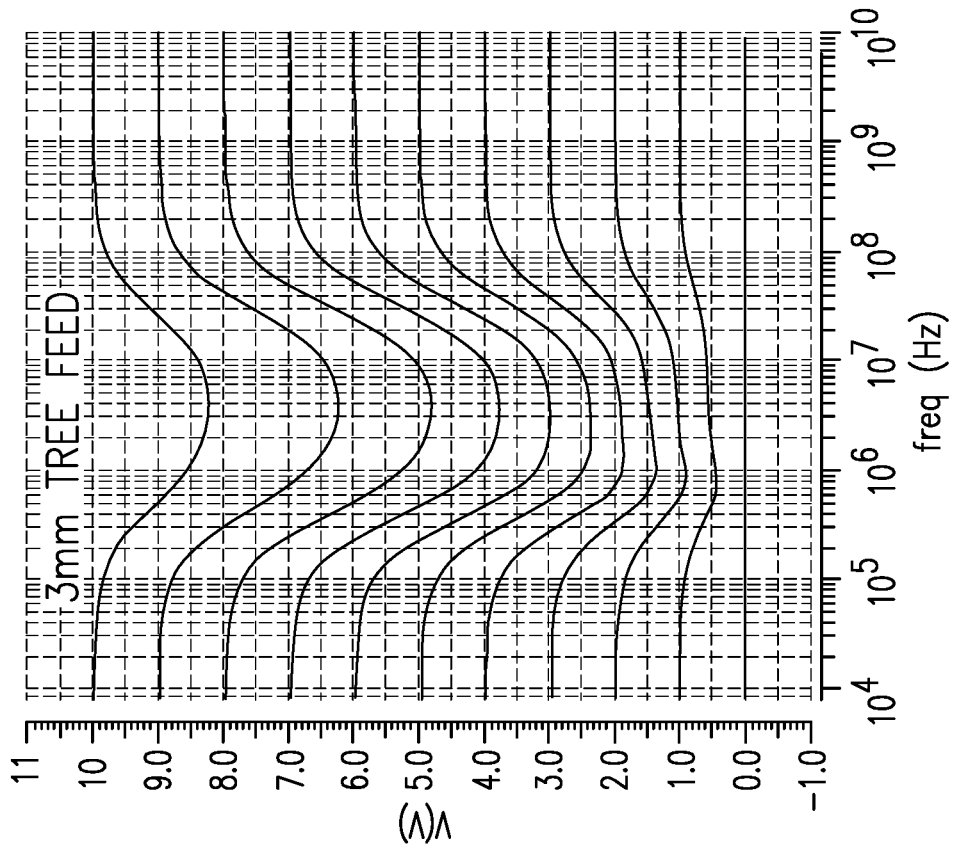
FIG. 13 shows an example of voltage division characteristics of the example series arm of FIG. 9.
Figure 14:
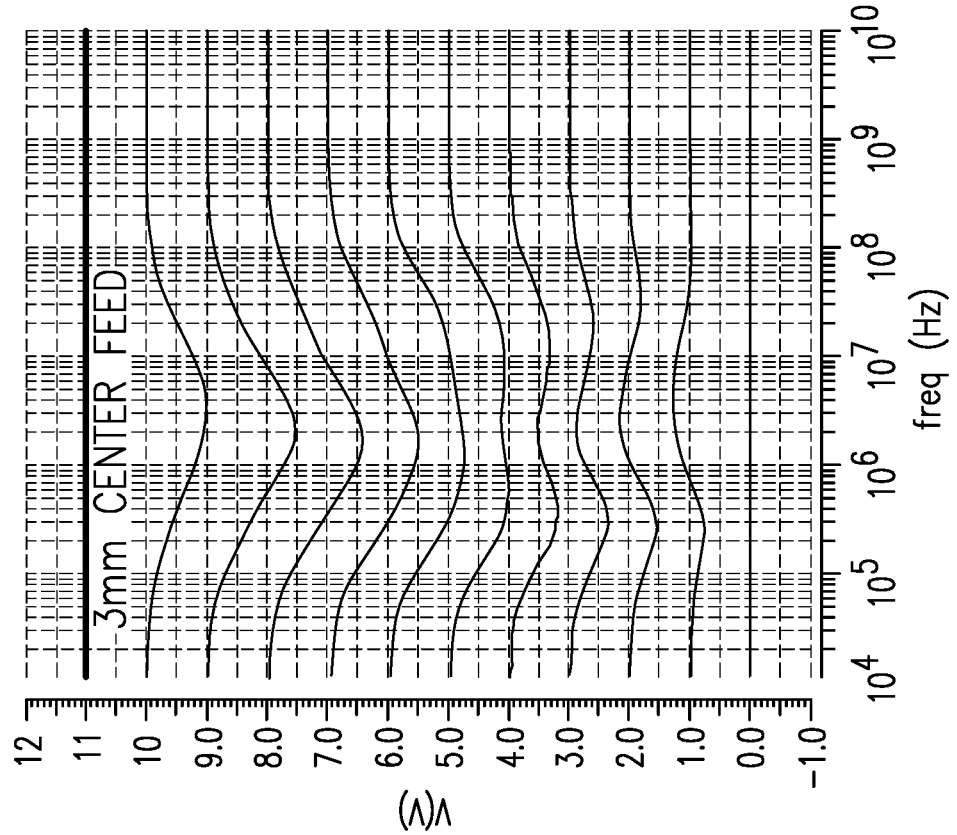
FIG. 14 shows voltage division characteristics of a series arm similar to the example of FIG. 2.

FIG. 13 shows an example of voltage division characteristics of the example series arm of FIG. 9, and FIG. 14 shows voltage division characteristics of a series arm similar to the example of FIG. 2, with 3 µm FETs. From the examples of FIGS. 13 and 14, it is noted that voltage division characteristic is excellent at mid-band and high-band regions with both of the series arm configurations. For example, there is little or no change in P1dB or Pmax under VSWR. It is further noted that the series arm configuration of FIG. 13 has better voltage division characteristic at a lower frequency, and such a characteristic may result in improved intermodulation distortion (IMD) with low frequency blockers.

Figure 15:
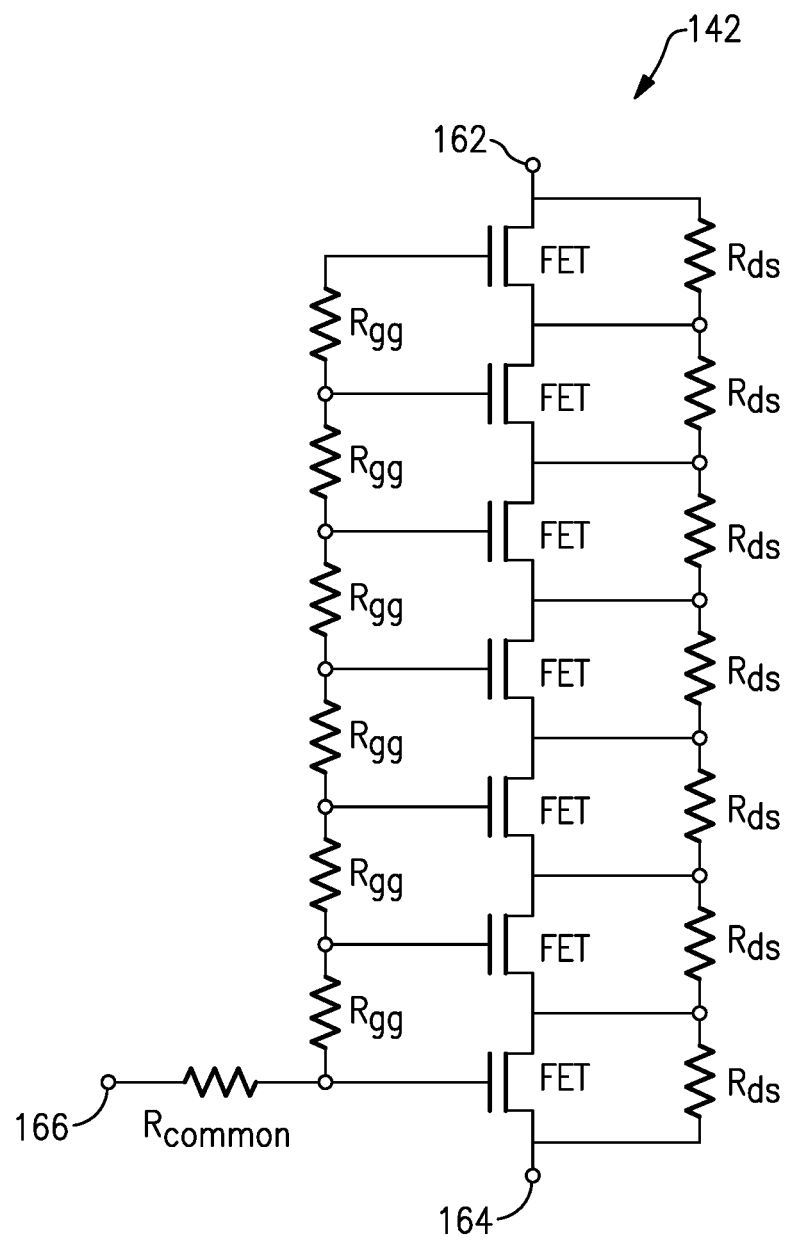
FIG. 15 shows a shunt arm that can be implemented for either or both of the shunt arms of FIG. 7.

FIG. 15 shows a shunt arm 142 that can be implemented for either or both of the shunt arms 142a, 142b of FIG. 7. In the example of FIG. 15, seven FETs are shown to be arranged in a stack between nodes 162, 164. In some embodiments, the node 162 can be a signal node, the node 164 can be a ground node.

FIG. 15 shows that in some embodiments, drain and source of each FET can be coupled by a drain-source resistor $R_{ds}$. Thus, the seven example drain-source resistors are shown to be arranged in series, with each in-between-resistors node being coupled to a corresponding in-between FETs node. In some embodiments, each of the drain-source resistors can have an approximately same resistance value.

FIG. 15 further shows that in some embodiments, gates of neighboring pair of FETs can be coupled by a gate-gate resistor $R_{gg}$. Accordingly, the six example gate-gate resistors are shown to be arranged in series, with each in-between-resistors node being coupled to a corresponding gate, and each end node of the resistor chain being coupled to a corresponding gate of the end FET.

In some embodiments, the gates of the FETs can be provided with bias signals from a bias signal node 166, through a common resistor $R_{common}$, through a feed node 168, and directly or through respective one or more gate-gate resistors $R_{gg}$s. In some embodiments, the feed node 168 can be selected to be an end feed node, or an approximately end feed node. In some embodiments, such an end feed node can be the ground node or be coupled to the ground node.

In some embodiments, each of the gate-gate resistors can have an approximately same resistance value. Such a resistance value $R_{gg}$ can be selected to provide a desired Roff characteristics. An example of such a resistance value $R_{gg}$ for an example FET stack is described herein in reference to FIG. 16.

In some embodiments, a drain-source resistance value $R_{ds}$ can be selected to provide a desired functionality. For example, a reduced drain-source resistance value $R_{ds}$ can provide a lower roll-off at a higher frequency. In another example, a reduced drain-source resistance value $R_{ds}$ can be selected to maintain an acceptable switching time. An example of such a resistance value $R_{ds}$ for an example FET stack is described herein in reference to FIG. 16.

In some embodiments, the bodies of the FETs may or may not be biased. If such body-biasing is present, such biasing can be implemented similar to the gate biasing configuration. For example, body-body resistors can be provided similar to the gate-gate resistors, and such an arrangement of body-body resistors can be provided with a center feed node for biasing the bodies of the FETs.

Figure 16:
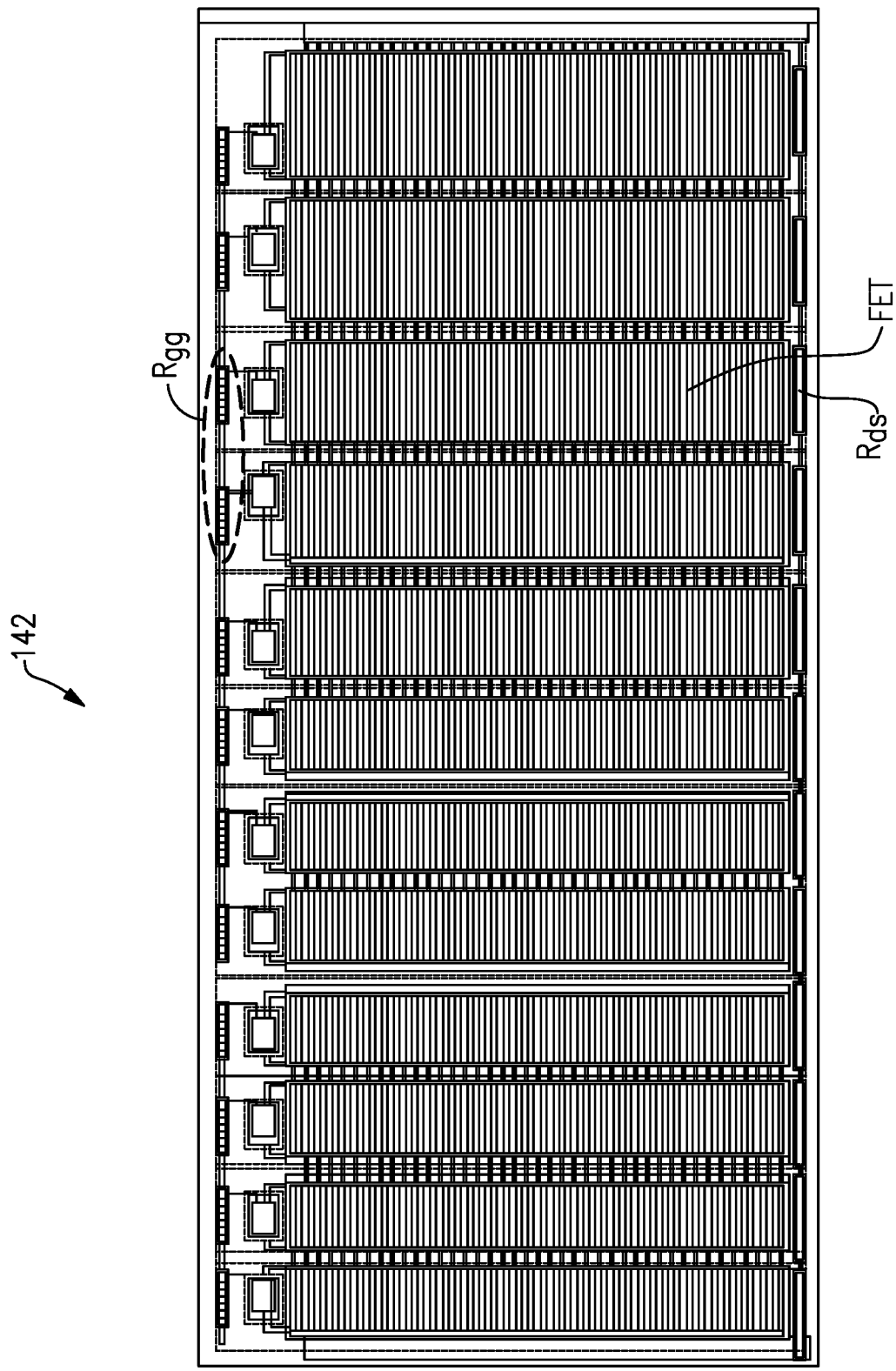
FIG. 16 shows an example layout of a shunt arm having twelve FETs arranged in a stack.

FIG. 16 shows an example layout of a shunt arm 142 having twelve FETs arranged in a stack. Drain-source resistors ($R_{ds}$) and gate-gate resistors ($R_{gg}$) are indicated. In the example of FIG. 16, the FETs are shown to have varying sizes. In the example of FIG. 16, the gate-gate resistors are not scaled accordingly. In some embodiments, gate-gate resistors may or may not scale with the FET sizes.

In the example of FIG. 16, each drain-source resistor ($R_{ds}$) has a resistance value of approximately 20KΩ and dimensions of approximately W/L=0.7 µm/9 µm. It is noted that since switching is dominated by the series of gate-gate resistors, the size of drain-source resistors can be increased.

In the example of FIG. 16, each gate-gate resistor ($R_{gg}$) has a resistance value of approximately 10KΩ and dimensions of approximately W/L=0.7 µm/4 µm. It is noted that the gate-gate resistor of the shunt arm 142 can be larger than the gate-gate resistor of the series arm (140 in FIG. 9), since the gate capacitance is lower.

In the example of FIG. 16, the common resistor ($R_{common}$) has a resistance value of approximately 10KΩ and dimensions of approximately W/L=0.75 µm/5 µm, which is similar to the size of the gate-gate resistor. It is noted that since the larger resistance of the common resistor ($R_{common}$) no longer increases Roff (since it sees very little RF voltage), the common resistor can be kept relatively small.

In some embodiments, and as described above, the foregoing resistors (drain-source, gate-gate, and common) can be implemented as relatively narrow resistors, without serpentine configuration, and such resistor configurations can be implemented in a layout to minimize or reduce parasitic capacitance resulting from inter-resistors routing effect. In some embodiments, the drain-source, gate-gate, and common resistors can have relatively small values as described herein to provide a reduction in dissipative loss. In some embodiments, such a reduction in dissipative loss may be accompanied by an increase in switching and settling times. Examples of such switching and settling times are described herein in greater detail.

Figure 17:
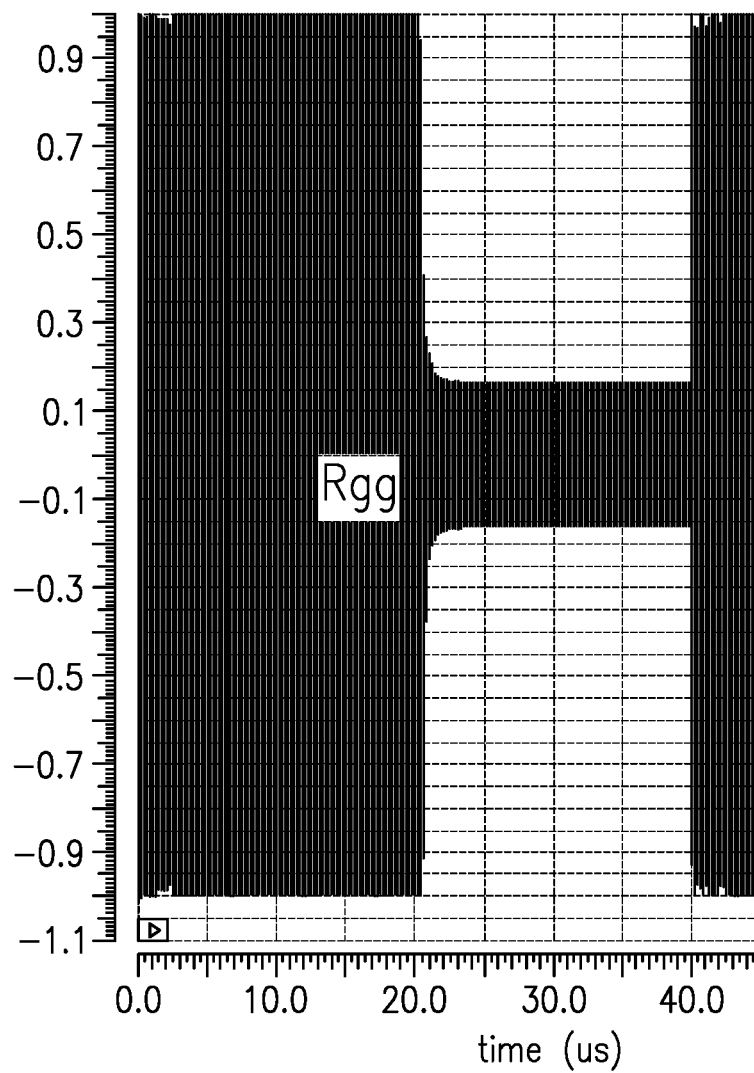
FIG. 17 shows an example of a switching time characteristic of the example shunt arm of FIG. 16.

FIG. 17 shows an example of a switching time characteristic of the example shunt arm of FIG. 16. It is noted that for the baseline configuration, the turn-off time Toff (to open the shunt arm) is less than 1.0 µs, and the turn-on time (to shunt the signal through the shunt arm) is also less than 1.0 µs. For the example series arm of FIG. 6, the turn-off time Toff (to open the shunt arm) is less than 1.0 µs, and the turn-on time (to shunt the signal through the shunt arm) is less than 2.5 µs. Thus, one can see that switching time can be slower for the example of FIG. 16; however, such switching times can be sufficient for some switching applications.

Figure 18:
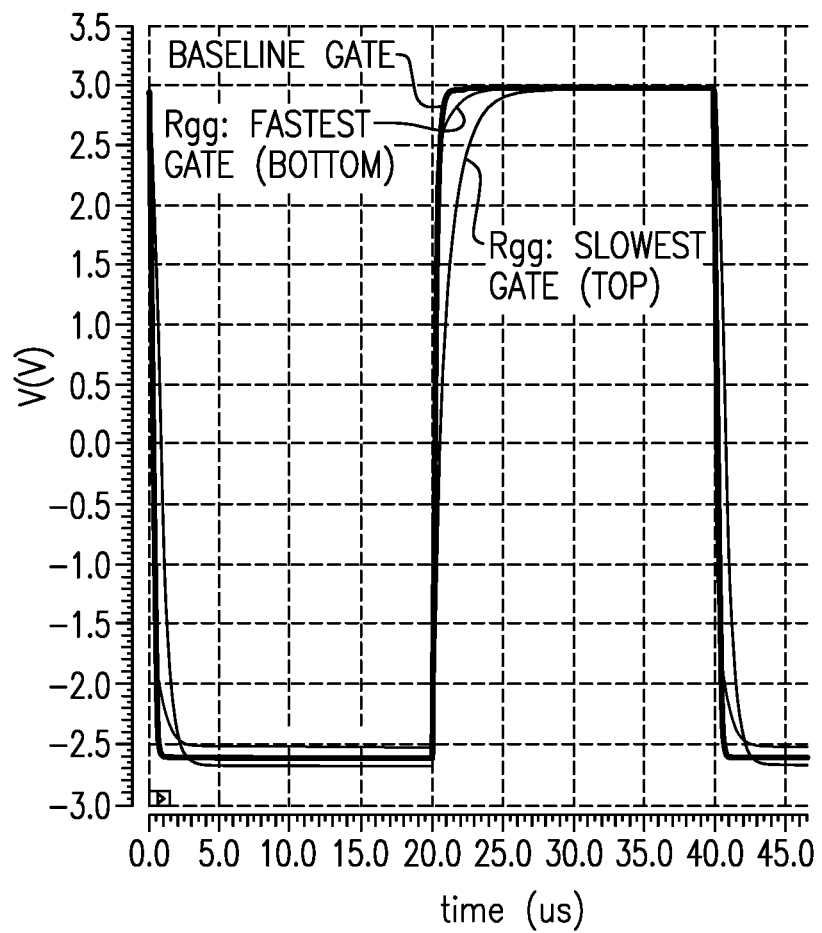
FIG. 18 shows examples of settling time characteristics of the example shunt arm of FIG. 16, and the baseline series arm.

FIG. 18 shows examples of settling time characteristics of the example shunt arm of FIG. 16 (end feed with slowest gate and end feed with fastest gate), and the baseline series arm (e.g., the baseline configuration described herein in reference to FIGS. 4 and 5). From the examples of FIG. 18, it is noted that for the baseline configuration, the settling time is approximately 2 µs. For the example shunt arm of FIG. 16, the settling time is less than 5 µs. Thus, one can see that settling time can be slower for the example of FIG. 16; however, such settling time can be sufficient for some switching applications.

Figure 20:
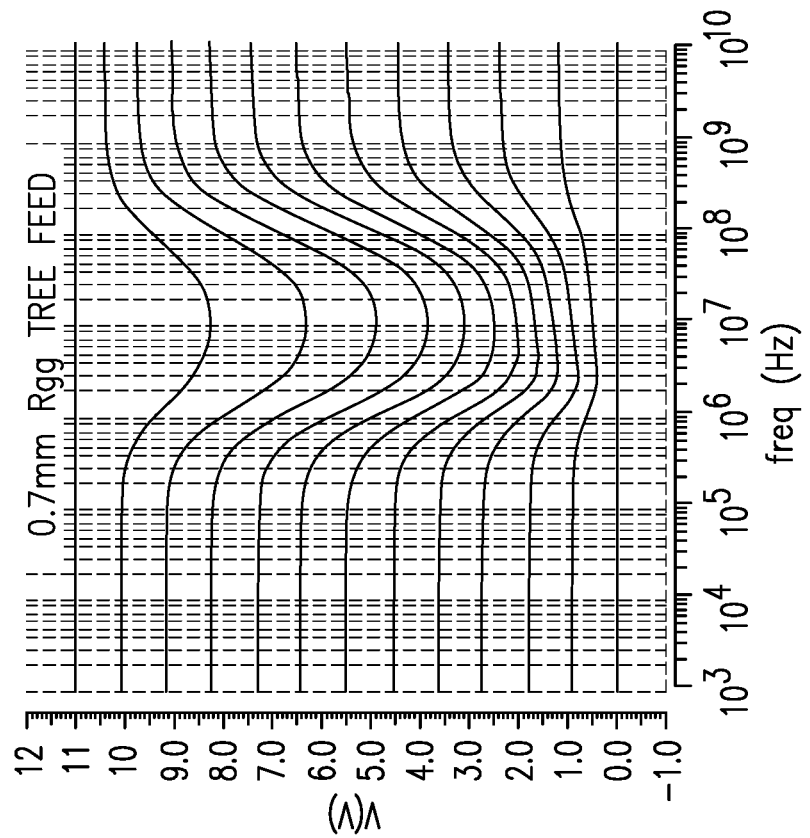
FIG. 20 shows voltage division characteristics of a shunt arm similar to the example of FIG. 2, with 0.7 μm FETs.
Figure 19:
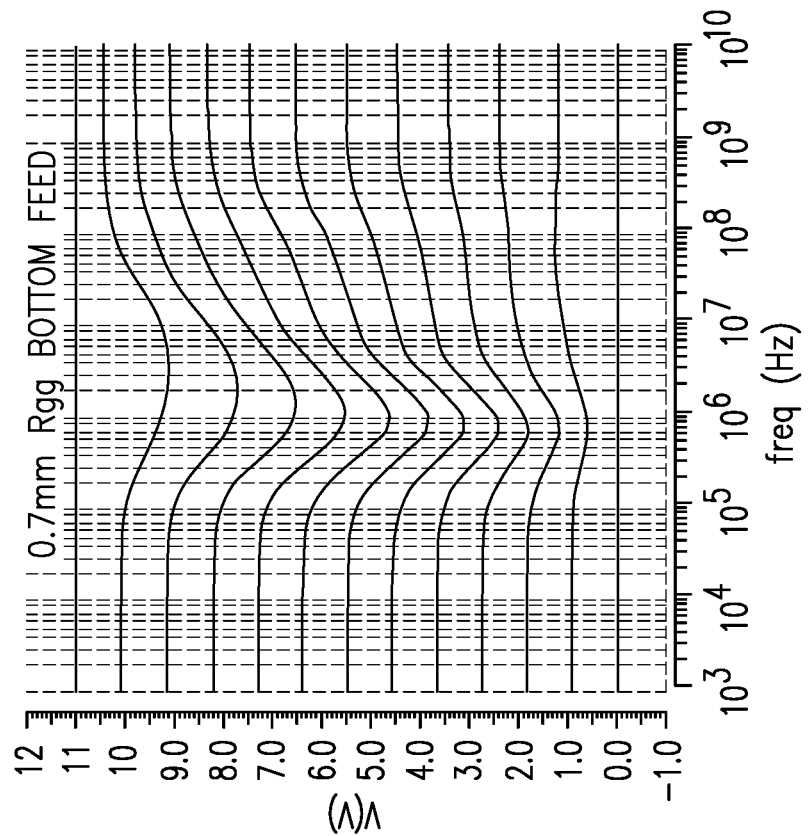
FIG. 19 shows an example of voltage division characteristics of the example shunt arm of FIG. 16.

FIG. 19 shows an example of voltage division characteristics of the example shunt arm of FIG. 16, and FIG. 20 shows voltage division characteristics of a shunt arm similar to the example of FIG. 2, with 0.7 µm FETs. From the examples of FIGS. 19 and 20, it is noted that voltage division characteristic is excellent at mid-band and high-band regions with both of the shunt arm configurations. For example, there is little or no change in P1dB or Pmax under VSWR at mid-band and high-band regions. It is further noted that the shunt arm configuration of FIG. 19 has unequal voltage division due to the FET size scaling. If parasitic effects relative to ground were full accounted for, the voltage division can be more balanced at higher frequency but not at lower frequency.

In some embodiments, the end feed configuration of the gate-gate resistors can improve intermodulation distortion (IMD) with low frequency blockers, since better voltage division characteristic can be achieved at, for example MHz frequencies. It is noted that the end feed configuration of the gate-gate resistors might improve voltage handling/harmonics characteristics at low band; however, since a shunt arm can have larger gate-gate resistors and larger periphery device size, such a shunt arm might not suffer from this issue.

As described herein, a switch having one or more features as described herein can include gate-gate resistor configurations in either or both of series and shunt arms, and such a switch can provide performance improvements such as reduced insertion loss. For example, a reduction of insertion loss by about 0.08 dB is expected. Measurements of insertion loss show a reduction of 0.04 dB to 0.09 dB. Such improved insertion loss performance can be broadband; and improvement can be achieved for low-band. For such a low-band, a reduction of about 0.05 dB can be achieved with use of the end feed configuration of a shunt arm as described herein.

As described herein, the foregoing improvement in insertion loss performance can be accompanied by a slower switching speed. For example, a 1 μs switching speed can be slowed to about 3.5 μs.

As described herein, the foregoing improvement in insertion loss performance can be accompanied by a slower settling speed. For example, a 3 μs settling speed can be slowed to about 10 μs.

In some embodiments, and as described herein, a switch having one or more features as described herein can be configured to include a gate-gate resistor configuration in the shunt arm (e.g., end feed) only, a gate-gate resistor configuration in the series arm (e.g., center feed) only, or both of the shunt arm and series arm.

Figure 21:
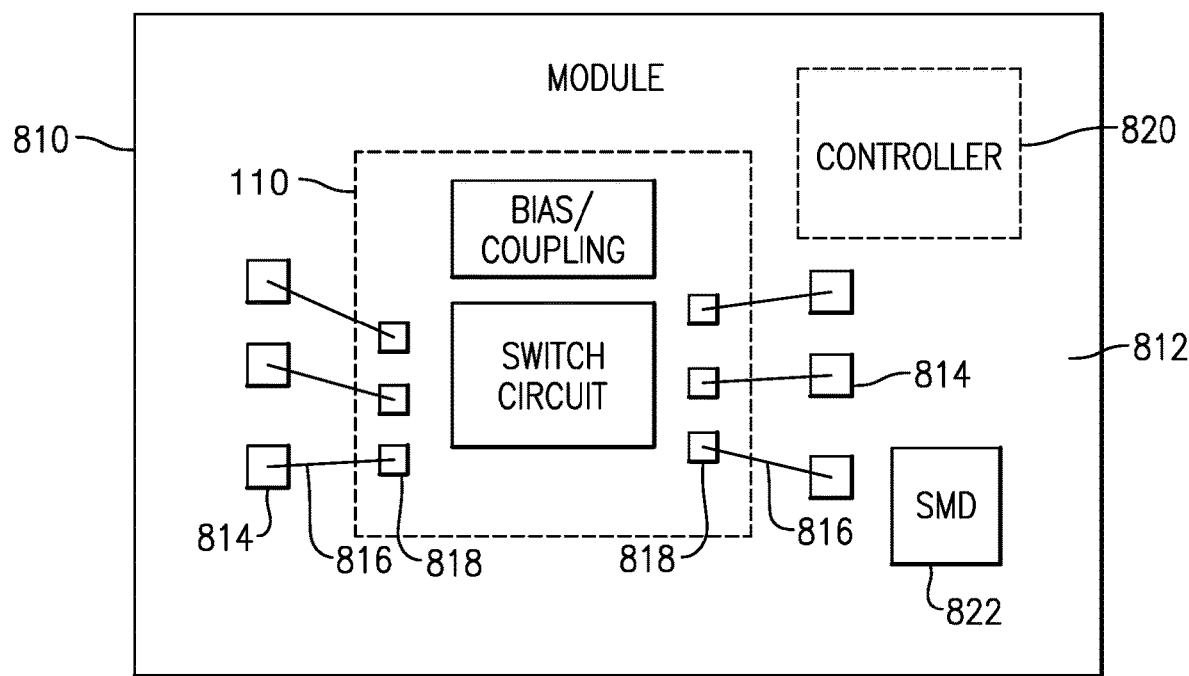
FIG. 21 shows that in some embodiments, one or more features of the present disclosure can be implemented in a packaged module.

In some embodiments, a switch device or architecture having one or more features described herein can be implemented in a packaged module. An example of such a module is shown in FIG. 21. Although described in the context of both of a switch circuit and a bias/coupling circuit being on the same die, it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more die. In the example shown, a switch device 110 having one or more features as described herein can be implemented on a die. Such a die can be electrically connected to other parts of the module (and with each other where more than one die is utilized) through connections such as connection-wirebonds 816. Such connection-wirebonds can be formed between contact pads 818 formed on the die and contact pads 814 formed on the packaging substrate 812. In some embodiments, one or more surface mounted devices (SMDs) 822 can be mounted on the packaging substrate 812 to support various functionalities of the module 810.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 22:
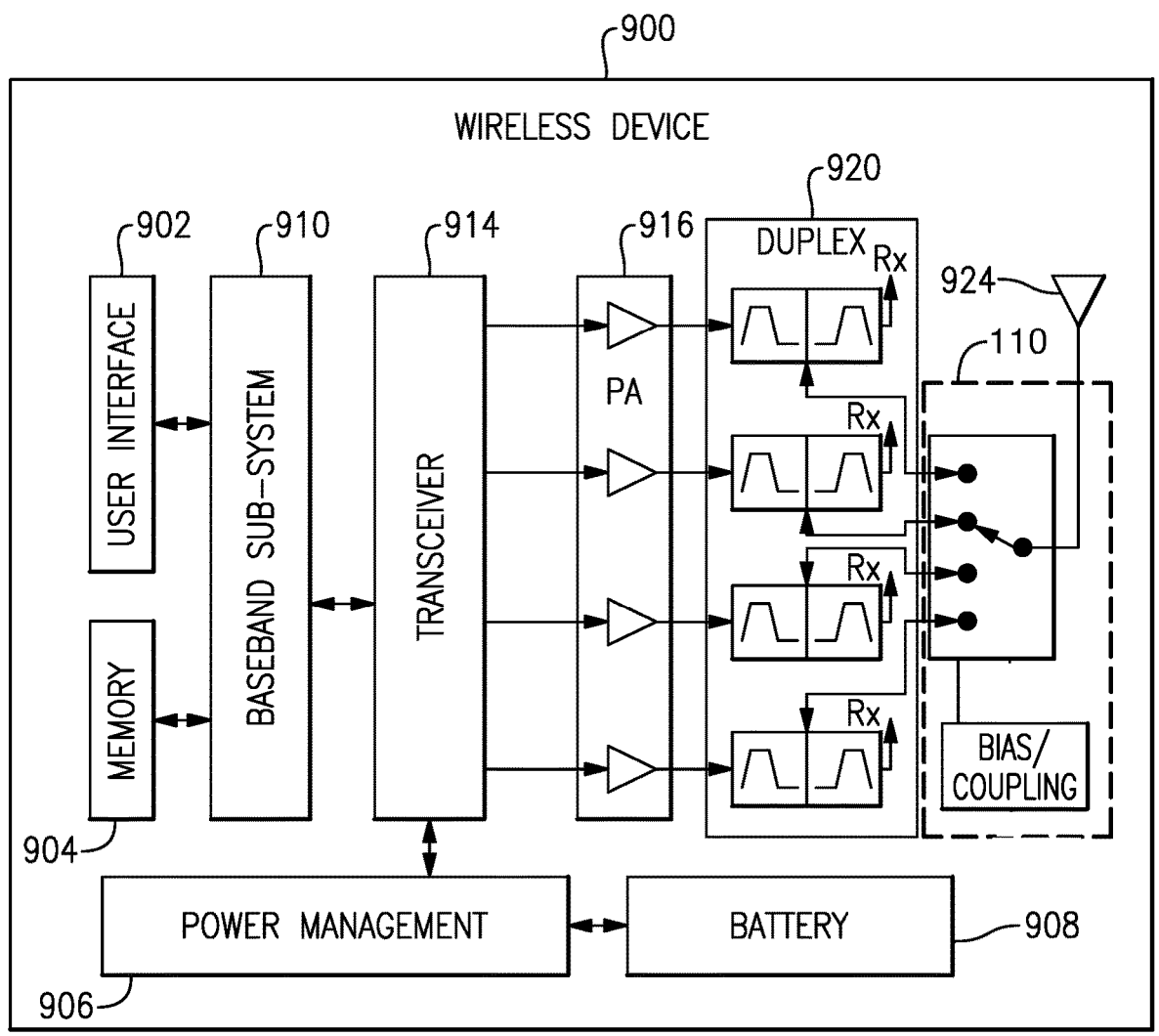
FIG. 22 shows an example wireless device having one or more features of the present disclosure.

FIG. 22 depicts an example wireless device 900 having one or more advantageous features described herein. In some embodiments, a switch device or architecture 110 having one or more features as described herein can be implemented in a number of locations, such as, for example, a switching module, a front-end module, etc. In some embodiments, such a module can support, for example, various transmit and/or receive operations of the wireless device 900.

In the example wireless device 900, a power amplifier (PA) module 916 having a plurality of PAs can provide an amplified RF signal to the switch device 110 (via a duplexer 920), and the switch device 110 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 22, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for operating a radio-frequency switch, the method comprising:
   providing a series arm including a plurality of transistors implemented in a stack configuration between a first node and a second node, each transistor having a source, a drain and a gate, the transistors configured to be in an ON state or an OFF state to respectively allow or inhibit passage of a signal between the first and second nodes;
   providing a shunt arm including a plurality of transistors implemented in a stack configuration between the first node and a ground node, each transistor having a source, a drain and a gate, the transistors of the shunt arm configured to be in an ON state when the transistors of the series arm are in the OFF state, or an OFF state when the transistors of the series arm are in the ON state;
   biasing the transistors of the series arm from a bias node through a feed node of the series arm and a circuit including a gate-gate resistor that couples each pair of neighboring transistors of the series arm, such that the gate of a selected transistor of the series arm is provided with a bias signal directly from the feed node of the series arm; and
   biasing the transistors of the shunt arm from a bias node through a feed node of the shunt arm and a circuit including a gate-gate resistor that couples each pair of neighboring transistors of the shunt arm, such that the gate of an end transistor of the shunt arm is provided with a bias signal directly from the feed node of the shunt arm.

2. The method of claim 1 wherein the selected transistor of the series arm is a center transistor if the series arm has an odd number of transistors, or a first transistor from the center of the stack if the series arm has an even number of transistors.

3. The method of claim 1 wherein the end transistor of the shunt arm is on the side of the ground node.

4. The method of claim 1 wherein the first node is an input node and the second node is an output node for the signal.

5. The method of claim 1 wherein the second node is an input node and the first node is an output node for the signal.

6. A method for fabricating a radio-frequency switch, the method comprising:
   forming or providing a series arm including a plurality of transistors implemented in a stack configuration between a first node and a second node, each transistor having a source, a drain and a gate, the transistors configured to be in an ON state or an OFF state to respectively allow or inhibit passage of a signal between the first and second nodes;
   forming or providing a shunt arm including a plurality of transistors implemented in a stack configuration between the first node and a ground node, each transistor having a source, a drain and a gate, the transistors of the shunt arm configured to be in an ON state when the transistors of the series arm are in the OFF state, or an OFF state when the transistors of the series arm are in the ON state;
   forming a series arm bias circuit configured to bias the transistors of the series arm from a bias node through a feed node of the series arm and a circuit including a gate-gate resistor that couples each pair of neighboring transistors of the series arm, such that the gate of a selected transistor of the series arm is provided with a bias signal directly from the feed node of the series arm; and
   forming a shunt arm bias circuit configured to bias the transistors of the shunt arm from a bias node through a feed node of the shunt arm and a circuit including a gate-gate resistor that couples each pair of neighboring transistors of the shunt arm, such that the gate of an end transistor of the shunt arm is provided with a bias signal directly from the feed node of the shunt arm.

7. The method of claim 6 wherein the transistors of the series arm and the transistors of the shunt arm are implemented on a silicon-on-insulator substrate.

8. The method of claim 7 wherein the series arm bias circuit and the shunt arm bias circuit are implemented on the silicon-on-insulator substrate.

9. The method of claim 6 wherein the selected transistor of the series arm is a center transistor if the series arm has an odd number of transistors, or a first transistor from the center of the stack if the series arm has an even number of transistors.

10. The method of claim 6 wherein the end transistor of the shunt arm is on the side of the ground node.

11. The method of claim 6 further comprising forming a drain-source resistor that couples the drain and source of each transistor of the series arm.

12. The method of claim 6 further comprising forming a drain-source resistor that couples the drain and source of each transistor of the shunt arm.

13. The method of claim 6 further comprising forming a body-body resistor that couples bodies of each pair of neighboring transistors of the series arm.

14. The method of claim 6 further comprising forming a body-body resistor that couples bodies of each pair of neighboring transistors of the shunt arm.

* * * * *